US 6,589,806 B2

(12) United States Patent  (10) Patent No.: US 6,589,806 B2
Sasaki  (45) Date of Patent: Jul. 8, 2003

(54) METHOD OF FABRICATING SEMICONDUCTOR LASER FOR PREVENTING TURN-ON OF PNPN THYRISTER

(75) Inventor: Yoshihiro Sasaki, Tokyo (JP)

(73) Assignee: NEC Electronics Corporation, Kanagawa (JP)

(*) Notice: Subject to any disclaimer, the term of this patent is extended or adjusted under 35 U.S.C. 154(b) by 0 days.

(21) Appl. No.: 09/924,604

(22) Filed: Aug. 9, 2001

(65) Prior Publication Data
US 2002/0027934 A1 Mar. 7, 2002

Related U.S. Application Data

(62) Division of application No. 09/332,025, filed on Jun. 14, 1999.

(30) Foreign Application Priority Data

Jun. 16, 1998 (JP) .......................................... 10-168601

(51) Int. Cl.⁷ ................................................ H01L 21/00
(52) U.S. Cl. ...................... 438/31; 438/22; 438/29; 438/30; 438/39; 438/45; 438/46; 438/133
(58) Field of Search .............................. 438/22, 29, 30, 438/31, 39, 45, 46, 133

(56) References Cited

U.S. PATENT DOCUMENTS 4,561,096 A    12/1985  Namizaki et al.
5,398,255 A  *  3/1995  Terakado ..................... 372/46
5,442,649 A  *  8/1995  Kokubo et al. ............... 372/46
5,847,415 A  * 12/1998  Sakata ......................... 257/96

FOREIGN PATENT DOCUMENTS

EP    001022826 A2  *  7/2000
JP    58-223395        12/1983
JP    59-124183         7/1984
JP    4-239792          8/1992
JP    5-67849           3/1993
JP    5-299771         11/1993
JP    8-130341          5/1996
JP    8-213691          8/1996
JP    8-330676         12/1996
JP    9-266349         10/1997
JP    10-303499        11/1998

* cited by examiner

Primary Examiner—Long Pham
(74) Attorney, Agent, or Firm—McGinn & Gibb, PLLC

(57) ABSTRACT

There is provided a semiconductor laser including (a) an n-type semiconductor substrate, (b) an active layer formed on the n-type semiconductor substrate, (c) a first p-type semiconductor layer formed adjacent to the active layer, (d) an n-type semiconductor layer formed adjacent to the first p-type semiconductor layer, (e) a second p-type semiconductor layer formed adjacent to the n-type semiconductor layer, and (f) a lightly doped n-type semiconductor layer formed between the n-type substrate and the first p-type semiconductor layer. The semiconductor laser prevents a pnpn thyrister from turning on to thereby ensure sufficient block breakdown voltage even at a high temperature or even when much current is applied thereto.

21 Claims, 6 Drawing Sheets

METHOD OF FABRICATING SEMICONDUCTOR LASER FOR PREVENTING TURN-ON OF PNPN THYRISTER

This is a division of application Ser. No. 09/332,025 filed Jun. 14, 1999.

BACKGROUND OF THE INVENTION

1. Field of the Invention

The invention relates to a semiconductor laser comprised of a pnpn thyrister and including a current strangulation structure, and also to a method of fabricating the same.

2. Description of the Related Art

A semiconductor laser including an active layer formed by selective growth and having a pnpn thyrister block structure formed by selective growth can be fabricated without carrying out a step of etching a semiconductor layer. Hence, a width of an active layer can be accurately controlled, ensuring uniformity in characteristic and reproducibility of a semiconductor laser.

FIG. 1 illustrates one of conventional semiconductor lasers having such a structure as mentioned above.

The illustrated semiconductor laser is comprised of an n-InP substrate 701, an electrode 711 formed on a lower surface of the n-InP substrate 701, a stripe including an n-InP clad layer 703, an MQW active layer 704, and a p-InP clad layer 705, a p-InP block layer 707 covering the n-InP substrate 701 and the stripe therewith, an n-InP block layer 708 formed on the p-InP block layer 707, a p-InP clad layer 709 formed on the n-InP block layer 708, a p-InGaAs cap layer 710 formed on the p-InP clad layer 709, and an electrode 712 formed on the p-InGaAs cap layer 710.

In the illustrated semiconductor laser, since a current is strangulated in the stripe including the MQW active layer 704, around the stripe is formed a pnpn thyrister block structure comprised of the n-InP substrate 701, the p-InP block layer 707, the n-InP block layer 708, and the p-InP clad layer 709. The pnpn thyrister block structure prevents a current from running outside the stripe.

Japanese Unexamined Patent Publication No. 5-67849 has suggested a semiconductor light-emitting device including a p-InP substrate formed with a mesa-stripe, an n-InP block layer, a p-InP buffer layer, an InGaAsP active layer, and n-InP clad layer all deposited on the p-InP substrate, a p-InP buried layer, an n-InP current-blocking layer, and a p-InP current-blocking layer all deposited in a recess formed in the InGaAsP active layer and the n-InP clad layer, an n-InP buried layer covering the n-InP clad layer and the p-InP current-blocking layer therewith, and a pair of electrodes.

Japanese Unexamined Patent Publication No. 8-330676 has suggested a semiconductor laser including a p-InP substrate, a pair of $SiO_2$ stripe masks formed on the p-InP substrate in a [011] direction and spaced away from each other by 1.5 $\mu$m, and a multi-layered structure including an active layer, formed in the 1.5 $\mu$m-space by MOVPE selective growth.

Japanese Unexamined Patent Publication No. 9-266349 has suggested a semiconductor laser including a p-InP substrate including a buffer layer, a trapezoidal selective growth portion formed on the p-InP substrate. The selective growth portion includes a p-clad layer, SCH strain MQW layer, and n-clad layer, and acts as a waveguide for a laser having a wavelength of 1.3 $\mu$m. Around the selective growth portion are deposited p-InP buried layer, n-InP layer, p-InP layer, and SCH-MQW carrier recombination layer. An n-InP clad buried layer covers the above-mentioned structure, and an n-InGaAsP contact layer is formed on the n-InP clad buried layer.

However, the above-mentioned conventional semiconductor lasers are accompanied with a problem that turn-on occurs in the pnpn thyrister at a high temperature or when much current is applied to the semiconductor lasers, and hence, it is not always ensured to provide a sufficient block breakdown voltage.

It is most effective to design a block layer to have a greater thickness in order to enhance a breakdown voltage of a thyrister. However, a thickness of a current-blocking layer has upper limitation in the above-mentioned conventional semiconductor lasers, because of a demand in a waveguide layer to have a small height. As a result, it is quite difficult or almost impossible in the above-mentioned conventional semiconductor lasers to make a thickness of a current-blocking layer greater in order to enhance a breakdown voltage of a thyrister.

SUMMARY OF THE INVENTION

In view of the above-mentioned problem, it is an object of the present invention to provide a semiconductor laser and a method of fabricating the same both of which is capable of preventing occurrence of turn-on in a pnpn thyrister, and providing a sufficient block breakdown voltage even at a high temperature or even when much current is applied to a pnpn thyrister.

In one aspect of the present invention, there is provided a semiconductor laser including (a) an n-type semiconductor substrate, (b) an active layer formed on the n-type semiconductor substrate, (c) a first p-type semiconductor layer formed adjacent to the active layer, (d) an n-type semiconductor layer formed adjacent to the first p-type semiconductor layer, (e) a second p-type semiconductor layer formed adjacent to the n-type semiconductor layer, and (f) a lightly doped n-type semiconductor layer formed between the n-type substrate and the first p-type semiconductor layer.

In accordance with the above-mentioned semiconductor laser, the lightly doped n-type semiconductor layer formed between the n-type substrate and the first p-type semiconductor layer suppresses electron-ejection into the first p-type semiconductor layer. As a result, it is possible to reduce the number of electrons passing through the first p-type semiconductor layer and charging up in the n-type semiconductor layer, ensuring enhancement in a breakdown voltage of a thyrister even at a high temperature or even when much current is applied to the thyrister.

The lightly doped n-type semiconductor layer contains an impurity at preferably $3\times10^{17}$ cm$^{-3}$ or smaller, and more preferably at $1\times10^{17}$ cm$^{-3}$ or smaller. Such concentration of an impurity more effectively suppresses electron-ejection into the adjacent p-type semiconductor layer, ensuring an increase in a breakdown voltage of a thyrister even at a high temperature or even when much current is applied to a thyrister.

There is no lower limitation in the concentration of an impurity. However, it is preferable that the lightly doped n-type semiconductor layer contains an impurity at such a concentration that there does not occur auto-dope caused by a p-type impurity. For instance, the lightly doped n-type semiconductor layer contains an impurity at preferably $1\times10^{15}$ cm$^{-3}$ or greater.

The lightly doped n-type semiconductor layer has a thickness of preferably 0.5 $\mu$m or greater, and more preferably 1.0 $\mu$m or greater.

If the lightly doped n-type semiconductor layer is too thin, there might occur the tunneling effect in which electrons pass through the lightly doped n-type semiconductor layer. There is no upper limitation in a thickness of the lightly doped n-type semiconductor layer, unless the thickness does not deteriorate a structure of a semiconductor laser.

For instance, the lightly doped n-type semiconductor layer is designed to contain Si, S or Se as an n-type impurity.

It is preferable that the lightly doped n-type semiconductor layer extends entirely over p-n junction plane, which would effectively suppress electron-ejection into the adjacent p-type semiconductor layer.

For instance, the lightly doped n-type semiconductor layer may be formed in the n-type semiconductor substrate, in which case, it is preferable that the lightly doped n-type semiconductor layer has a depth equal to a thickness of the n-type semiconductor substrate.

For instance, the lightly doped n-type semiconductor layer may be formed on the n-type semiconductor substrate.

There is further provided a semiconductor laser including (a) a p-type semiconductor substrate, (b) an active layer formed on the p-type semiconductor substrate, (c) a first n-type semiconductor layer formed adjacent to the active layer, (d) a p-type semiconductor layer formed adjacent to the first n-type semiconductor layer, (e) a second n-type semiconductor layer formed adjacent to the p-type semiconductor layer, and (f) a lightly doped n-type semiconductor layer formed between the p-type semiconductor layer and the second n-type semiconductor layer.

In accordance with the above-mentioned semiconductor laser, the lightly doped n-type semiconductor layer formed between the p-type semiconductor layer and the second n-type semiconductor layer suppresses electron-ejection into the p-type semiconductor layer. As a result, it is possible to reduce the number of electrons passing through the p-type semiconductor layer and charging up in the n-type semiconductor layer, ensuring enhancement in a breakdown voltage of a thyrister even at a high temperature or even when much current is applied to the thyrister.

The lightly doped n-type semiconductor layer contains an impurity at preferably $3 \times 10^{17}$ cm$^{-3}$ or smaller, and more preferably $1 \times 10^{17}$ cm$^{-3}$ or smaller.

For instance, the lightly doped n-type semiconductor layer may be designed to contain an impurity at $1 \times 10^{15}$ cm$^{-3}$ or greater.

There is still further provided a semiconductor laser including (a) a pnpn thyrister, (b) an n-type electrode making electrical contact with an n-type region located at an end of the pnpn thyrister, and (c) a lightly doped n-type semiconductor layer located adjacent to p-n junction plane closer to the n-type electrode among p-n junction planes of the pnpn thyrister.

In accordance with the above-mentioned semiconductor laser, the lightly doped n-type semiconductor layer located adjacent to p-n junction plane closer to the n-type electrode among p-n junction planes of the pnpn thyrister suppresses electron-ejection into a p-type semiconductor region. As a result, it is possible to reduce the number of electrons passing through the p-type semiconductor layer and charging up in the n-type semiconductor layer, ensuring enhancement in a breakdown voltage of a thyrister even at a high temperature or even when much current is applied to the thyrister.

In another aspect of the present invention, there is provided a method of fabricating a semiconductor laser, including the steps of (a) forming a lightly doped n-type semiconductor layer on or in an n-type semiconductor substrate, (b) ion-implanting an n-type impurity to the lightly doped n-type semiconductor layer to thereby partially turn the lightly doped n-type semiconductor layer into a heavily doped n-type semiconductor layer, (c) forming a light-waveguide layer on the heavily doped n-type semiconductor layer, the light-waveguide layer including an active layer, (d) forming a first p-type semiconductor layer on the lightly doped n-type semiconductor layer, (e) forming an n-type semiconductor layer on the first p-type semiconductor layer, and (f) forming a second p-type semiconductor layer on the light-waveguide layer and the n-type semiconductor layer.

In accordance with the above-mentioned method, it is possible to fabricate a semiconductor laser having a high breakdown voltage, in the reduced number of fabrication steps at a high fabrication yield.

The heavily doped n-type semiconductor layer contains an impurity at preferably $5 \times 10^{17}$ to $5 \times 10^{18}$ cm$^{-3}$, and more preferably $1 \times 10^{18}$ to $3 \times 10^{18}$ cm$^{-3}$.

The lightly doped n-type semiconductor layer contains an impurity at preferably $3 \times 10^{17}$ cm$^{-3}$ or smaller, more preferably $1 \times 10^{17}$ cm$^{-3}$ or smaller, and preferably $1 \times 10^{15}$ cm$^{-3}$ or greater.

There is further provided a method of fabricating a semiconductor laser, including the steps of (a) forming a heavily doped n-type semiconductor layer on or in an n-type semiconductor substrate, (b) forming a lightly doped n-type semiconductor layer entirely covering the heavily doped n-type semiconductor layer therewith, (c) at least partially removing the heavily doped n-type semiconductor layer and the lightly doped n-type semiconductor layer to thereby cause the heavily doped n-type semiconductor layer to appear, (d) forming a light-waveguide layer on the heavily doped n-type semiconductor layer, the light-waveguide layer including an active layer, (e) forming a first p-type semiconductor layer on the lightly doped n-type semiconductor layer, (f) forming an n-type semiconductor layer on the first p-type semiconductor layer, and (g) forming a second p-type semiconductor layer on the light-waveguide layer and the n-type semiconductor layer.

The above-mentioned method makes it possible to fabricate a lightly doped n-type semiconductor layer including fewer defects such as crystal defect.

For instance, the heavily doped n-type semiconductor layer and the lightly doped n-type semiconductor layer may be partially removed in the step (c) by chemical mechanical polishing or dry etching.

There is still further provided a method of fabricating a semiconductor laser, including the steps of (a) forming a lightly doped n-type semiconductor layer on an n-type semiconductor substrate, (b) patterning the lightly doped n-type semiconductor layer so that a space is formed in the thus patterned lightly doped n-type semiconductor layer, (c) forming a light-waveguide layer on the n-type semiconductor substrate in the space, the light-waveguide layer including an active layer, (d) forming a first p-type semiconductor layer on the lightly doped n-type semiconductor layer, (e) forming an n-type semiconductor layer on the first p-type semiconductor layer, and (f) forming a second p-type semiconductor layer on the light-waveguide layer and the n-type semiconductor layer.

There is yet further provided a method of fabricating a semiconductor laser, including the steps of (a) forming a first lightly doped p-type semiconductor layer on or in a p-type semiconductor substrate, (b) forming a light-waveguide layer on the first lightly doped p-type semiconductor layer, the light-waveguide layer including an active layer, (d) forming a first n-type semiconductor layer on the first lightly doped p-type semiconductor layer, (e) forming a first p-type semiconductor layer on the first n-type semiconductor layer, (f) forming an etching stopper layer on the first p-type semiconductor layer, (g) forming a second n-type semiconductor layer on the light-waveguide layer and the etching stopper layer, (h) etching the second n-type semiconductor layer so that a portion of the second n-type semiconductor layer remains only above the light-waveguide layer, and (i) depositing a second lightly doped n-type semiconductor layer on the etching stopper layer around the portion of the second n-type semiconductor layer.

There is still yet further provided a method of fabricating a semiconductor laser, including the steps of (a) forming a first lightly doped p-type semiconductor layer on or in a p-type semiconductor substrate, (b) forming a light-waveguide layer on the first lightly doped p-type semiconductor layer, the light-waveguide layer including an active layer, (c) forming a first n-type semiconductor layer on the first lightly doped p-type semiconductor layer, (d) forming a p-type semiconductor layer on the first n-type semiconductor layer, (e) forming a second n-type semiconductor layer on the light-waveguide layer and the p-type semiconductor layer, (f) forming a mask on the second n-type semiconductor layer, the mask having an opening located just above the light-waveguide layer, and (g) ion-implanting an n-type impurity into the second n-type semiconductor layer through the opening of the mask.

The advantages obtained by the aforementioned present invention will be described hereinbelow.

In accordance with the above-mentioned present invention, since a lightly doped n-type semiconductor layer is formed at a p-n junction plane, it is possible to enhance a block breakdown voltage at a high temperature or when much current is applied to a semiconductor laser, increase a saturated output, and reduce a drive current at a high temperature, ensuring longer lifetime of a semiconductor laser.

The above and other objects and advantageous features of the present invention will be made apparent from the following description made with reference to the accompanying drawings, in which like reference characters designate the same or similar parts throughout the drawings.

DESCRIPTION OF THE PREFERRED EMBODIMENTS

[First Embodiment]

Figure 1:
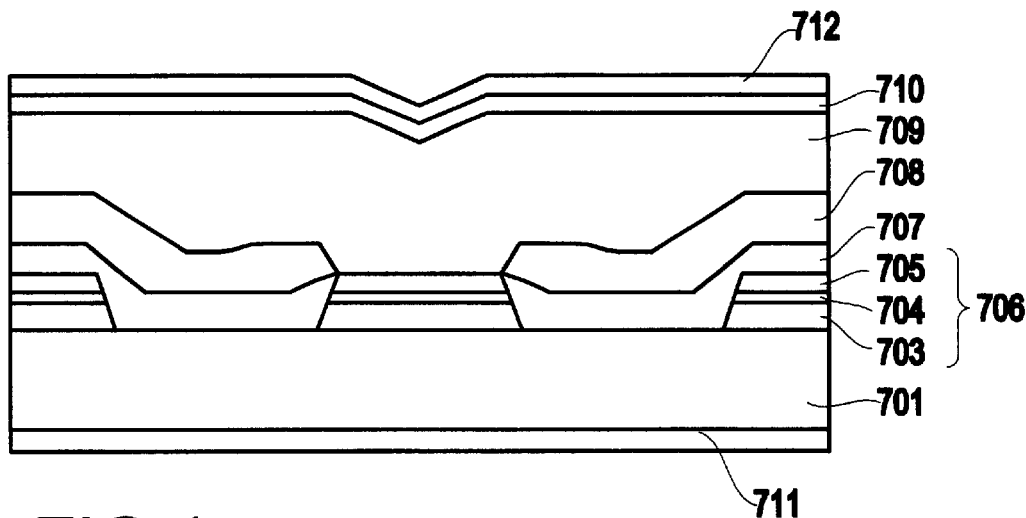
FIG. 1 is a cross-sectional view of a conventional semiconductor laser.
Figure 2:
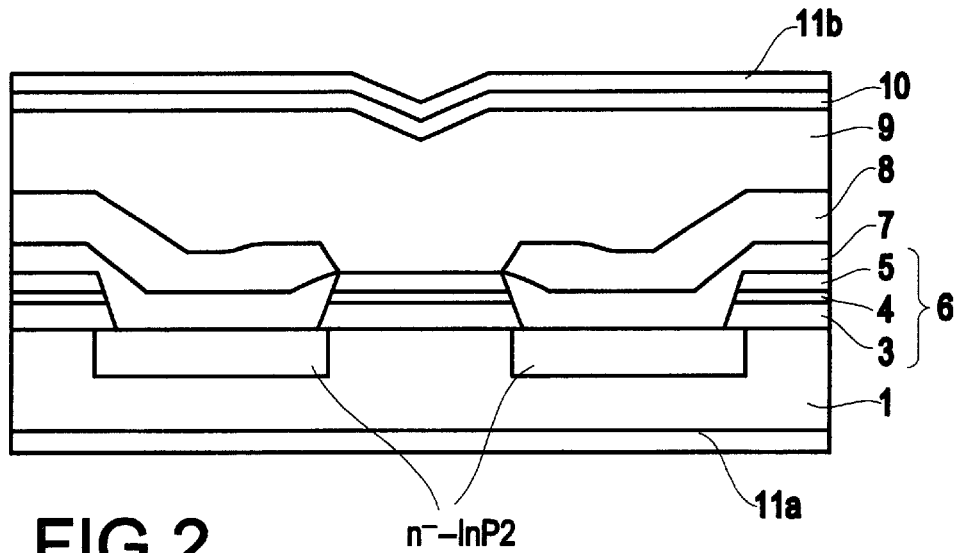
FIG. 2 is a cross-sectional view of a semiconductor laser in accordance with the first embodiment.

FIG. 2 is a cross-sectional view of a semiconductor laser in accordance with the first embodiment.

The illustrated semiconductor laser is comprised of an n-InP substrate 1, a lightly doped n-type InP layer 2 (n$^-$-InP), a waveguide layer 6 including an n-InP clad layer 3, an MQW active layer 4, and a p-InP clad layer 5, a p-InP block layer 7 covering the n-InP substrate 701 and the waveguide layer 6 therewith, an n-InP block layer 8 formed on the p-InP block layer 7, a p-InP buried layer 9 formed on the n-InP block layer 8, a p-InGaAs cap layer 10 formed on the p-InP buried layer 9, an n-side electrode 11a formed on a lower surface of the n-InP substrate 1, and a p-side electrode 11b formed on the p-InGaAs cap layer 10.

The n-InP substrate 1 has a concentration of an n-type impurity in the range of $1\times10^{18}$ cm$^{-3}$ to $3\times10^{18}$ cm$^{-3}$. The lightly doped n-type InP layer 2 has a concentration of an n-type impurity of $1\times10^{17}$ cm$^{-3}$, a width in the range of 3 to 5 µm, and a thickness in the range of 0.5 to 1 µm. The waveguide layer 6 has a width in the range of 1.2 to 1.6 µm. The p-InP block layer 7 has a concentration of a p-type impurity in the range of $4\times10^{17}$ cm$^{-3}$ to $6\times10^{17}$ cm$^{-3}$, and a thickness of 0.6 µm. The n-InP block layer 8 has a concentration of an n-type impurity in the range of $7\times10^{17}$ cm$^{-3}$ to $9\times10^{17}$ cm$^{-3}$, and a thickness of 0.6 µm. The p-InP buried layer 9 has a concentration of a p-type impurity in the range of $1\times10^{18}$ cm$^{-3}$ to $2\times10^{18}$ cm$^{-3}$, and a thickness of 2.5 µm. The p-InGaAs cap layer 10 has a concentration of a p-type impurity in the range of $1\times10^{19}$ cm$^{-3}$ to $2\times10^{19}$ cm$^{-3}$, and a thickness of 0.2 µm.

Since the highly doped n-InP substrate 1 is located just below the MQW active layer 4, a series resistance to electrons to flow into the MQW active layer 4 is made small. On the other hand, since the p-InP block layer 7 makes contact with the lightly doped n-type InP layer 2, the number of electrons to flow into the p-InP block layer 7 is made small.

Since the semiconductor laser in accordance with the first embodiment is formed at the n-InP substrate 1 with a strangulation structure to electrons, a rate of electron-ejection to the p-InP block layer 7 is suppressed, which ensures reduction in the number of electrons which pass through the p-InP current-blocking layer 7 and charging up in the n-InP current-blocking layer 8. Hence, a breakdown voltage of a thyrister is enhanced even at a high temperature or even when much current is applied to the thyrister.

[Second Embodiment]

FIGS. 3A to 3F illustrate respective steps of a method of fabricating a semiconductor laser, in accordance with the second embodiment.

Figure 3A:
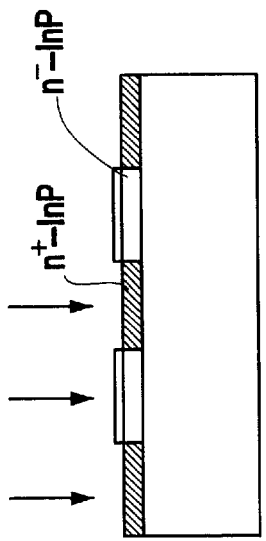
FIGS. 3A to 3F are cross-sectional views of a semiconductor laser, illustrating respective steps of a method of fabricating the same, in accordance with the second embodiment.

First, as illustrated in FIG. 3A, a lightly doped n-type InP layer 2 (n$^-$-InP) is formed on an n-InP substrate 1. The lightly doped n-type InP layer 2 has a concentration of an n-type impurity of $1\times10^{17}$ cm$^{-3}$ and a thickness in the range of 0.5 to 1 µm. The n-InP substrate 1 has a concentration of an n-type impurity in the range of $1\times10^{18}$ cm$^{-3}$ to $3\times10^{18}$ cm$^{-3}$.

Figure 3B:
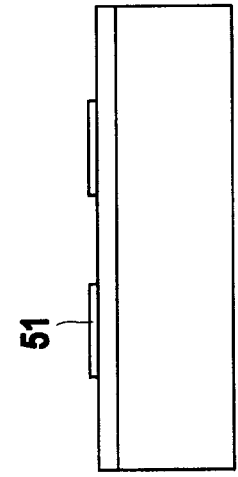

Then, as illustrated in FIG. 3B, a pair of masks 51 is formed on the n-InP substrate 1 by photolithography. The masks 51 are composed of dielectric material such as SiO$_2$. The masks 51 may be composed of SiN in place of SiO$_2$.

Each of the masks 51 is designed to have a width in the range of 3 to 5 μm. A space between a pair of the masks 51, that is, a width of an area in which an active layer is to be formed, is in the range of 1.0 to 1.6 μm.

Figure 3C:
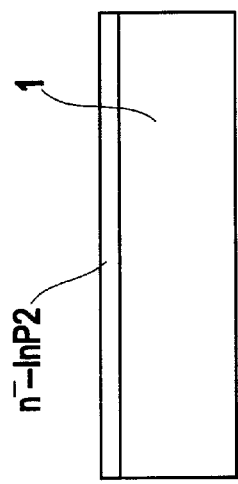

Then, as illustrated in FIG. 3C, an n-type impurity such as Si is ion-implanted into the lightly doped n-type InP layer 2 through the use of the masks 51. As a result, the lightly doped n-type InP layer 2 is partially turned into a heavily doped n-type InP region having a concentration of an n-type impurity in the range of $1 \times 10^{18}$ cm$^{-3}$ to $2 \times 10^{18}$ cm$^{-3}$.

Figure 3D:
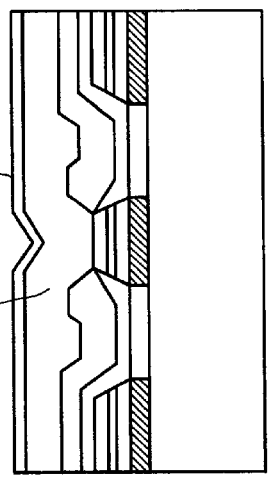

Then, as illustrated in FIG. 3D, there is formed a waveguide layer including an MQW active layer 4, an n-InP clad layer 3, and a p-InP clad layer 5, on the heavily doped n-type InP region by selective growth.

The n-InP clad layer 3 has a concentration of an n-type impurity in the range of $1 \times 10^{18}$ cm$^{-3}$ to $2 \times 10^{18}$ cm$^{-3}$, and a thickness in the range of 0.1 μm to 0.2 μm. The p-InP clad layer 5 has a concentration of a p-type impurity in the range of $5 \times 10^{17}$ cm$^{-3}$ to $7 \times 10^{17}$ cm$^{-3}$, and a thickness in the range of 0.1 μm to 0.2 μm The MQW active layer 4 is comprised of (a) an n-InGaAsP SCH layer having a composition of 1.13 μm, a concentration in the range of $1 \times 10^{18}$ cm$^{-3}$ to $2 \times 10^{18}$ cm$^{-3}$, and a thickness of 60 nm, (b) seven strained InGaAsP quantum well layers having 0.7% compression strain and a thickness of 4.5 nm, (c) an InGaAsP barrier layer having a composition of 1.13 μm and a thickness of 7 nm, and (d) a u-InGaAsP SCH layer having a composition of 1.13 μm and a thickness of 60 nm.

Figure 3E:
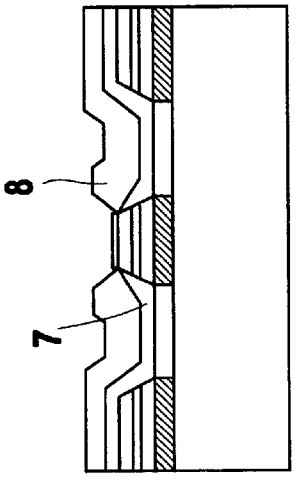

Then, there are formed masks only on the waveguide layers. Then, as illustrated in FIG. 3E, a p-InP block layer 7 and an n-InP block layer 8 are successively deposited over a resultant around the masks.

The p-InP block layer 7 has a concentration of a p-type impurity in the range of $4 \times 10^{17}$ cm$^{-3}$ to $6 \times 10^{17}$ cm$^{-3}$, and a thickness of 0.6 μm. The n-InP block layer 8 has a concentration of an n-type impurity in the range of $7 \times 10^{17}$ cm$^{-3}$ to $9 \times 10^{17}$ cm$^{-3}$, and a thickness of 0.6 μm.

Figure 3F:
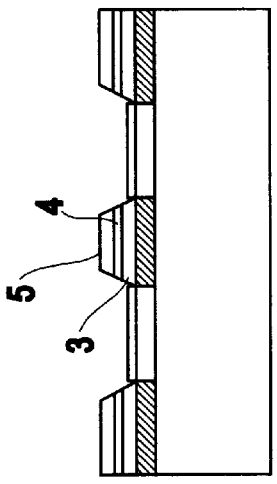

Then, as illustrated in FIG. 3F, a resultant is covered with a p-InP clad layer 9, and further with a p$^+$-InGaAs cap layer 10. The p-InP clad layer 9 has a concentration of a p-type impurity of $1 \times 10^{18}$ cm$^{-3}$, and a thickness of 2 μm. The p$^+$-InGaAs cap layer 10 has a concentration of a p-type impurity of $1 \times 10^{19}$ cm$^{-3}$, and a thickness of 0.2 μm.

In accordance with the above-mentioned method, since the masks 51 are used commonly for ion-implantation and selective growth, it is possible to form the heavily doped n-type InP region just below the active layer 4, and form the lightly doped n-type InP layer 2 just below the p-InP block layer 7 in self-align manner.

The experiment was conducted to confirm that a semiconductor laser fabricated in accordance with the above-mentioned method had superior output characteristic.

A semiconductor laser fabricated in accordance with the above-mentioned method was cleaved into a resonator length of 300 μm. An end protection film having a reflectance of 30% and composed of SiO$_2$ was formed at a front end, and a high reflectance film constituted of SiO$_2$/α-Si multiple layers was formed at a rear end of the thus cleaved semiconductor laser.

Then, the semiconductor laser was mounted on a boron-nitride heat sink in junction-down, and optical output characteristic of the semiconductor laser was measured. The semiconductor laser was oscillated at 1.3 μm, and showed that a threshold value was 7 mA and a slope efficiency was 0.5 W/A both at room temperature, and a threshold value was 15 mA and a slope efficiency was 0.4 W/A both at 85 degrees centigrade, and that a drive current at optical output of 14 mW was 60 mA.

In a conventional semiconductor laser where a region located just below a p-InP block layer had a p-type impurity concentration of $1 \times 10^{18}$ cm$^{-3}$, a drive current at optical output of 14 mW was 70 mA.

In comparison with the conventional semiconductor laser, it was confirmed that the semiconductor laser in accordance with the instant embodiment had superior high-temperature characteristics.

[Third Embodiment]

FIGS. 4A to 4F illustrate respective steps of a method of fabricating a semiconductor laser, in accordance with the third embodiment.

Figure 4A:
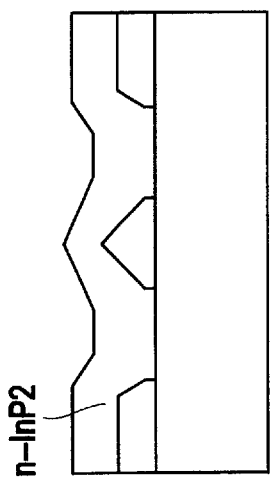
FIGS. 4A to 4F are cross-sectional views of a semiconductor laser, illustrating respective steps of a method of fabricating the same, in accordance with the third embodiment.

Then, as illustrated in FIG. 4A, a pair of masks 51 is formed on an n-InP substrate 1 by photolithography. The n-InP substrate 1 has a concentration of an n-type impurity in the range of $1 \times 10^{18}$ cm$^{-3}$ to $3 \times 10^{18}$ cm$^{-3}$. The masks 51 are composed of dielectric material such as SiO$_2$. The masks 51 may be composed of SiN in place of SiO$_2$. Each of the masks 51 is designed to have a width in the range of 5 to 8 μm. A space between a pair of the masks 51, that is, a width of an area in which an active layer is to be formed, is in the range of 1.2 to 1.6 μm.

Figure 4B:
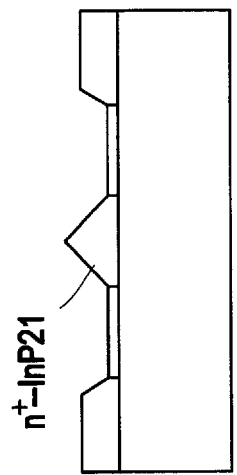

Then, as illustrated in FIG. 4B, heavily doped n-type InP regions 21 (n$^+$-InP) are formed on n-InP substrate 1 by selective growth. The heavily doped n-type InP regions 21 have a concentration of an n-type impurity in the range of $1 \times 10^{18}$ cm$^{-3}$ to $3 \times 10^{18}$ cm$^{-3}$.

Figure 4C:
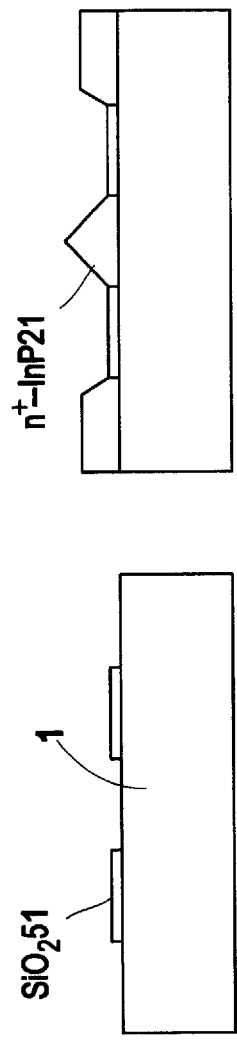

After etching the masks 51 off, as illustrated in FIG. 4C, a resultant is covered entirely with a lightly doped n-InP (n$^-$-InP) layer 2. The lightly doped n-InP layer 2 have a concentration of an n-type impurity of $1 \times 10^{17}$ cm$^{-3}$.

Figure 4D:
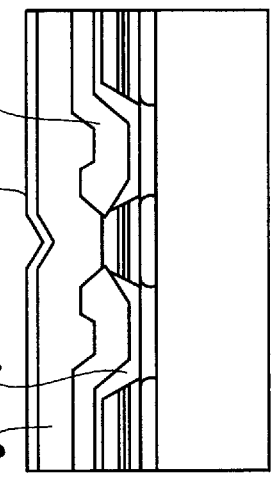

Then, as illustrated in FIG. 4D, a resultant is planarized by mechanical chemical polishing (CMP) until the heavily doped n-type InP regions 21 appear. Then, a λ/4-shift diffraction lattice 22 is formed on one of the exposed heavily doped n-type InP regions 21 by interference exposure or EB exposure. The λ/4-shift diffraction lattice 22 has a pitch of about 203 nm and a depth of 50 nm.

Then, masks 51 composed of SiO$_2$ are formed again by photolithography. Each of the masks 51 is designed to have a width in the range of 3 to 5 μm. A space between a pair of the masks 51, that is, a width of an area in which an active layer is to be formed, is in the range of 1.2 to 1.6 μm. The masks 51 are formed so that the space between the adjacent masks overlaps the heavily doped n-type InP layer 21.

Figure 4E:
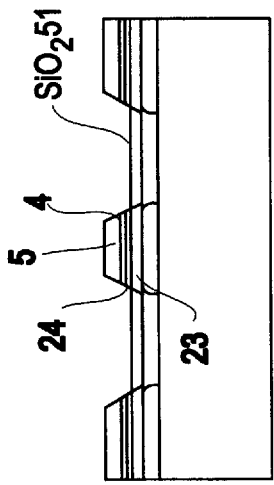

Then, as illustrated in FIG. 4E, there is formed a waveguide layer on the heavily doped n-type InP layer 21 by selective growth. The waveguide layer is constituted of an n-InGaAsP guide layer 23, an n-InP spacer layer 24, a MQW active layer 4, and a p-InP clad layer 5.

The n-InGaAsP guide layer 23 has a concentration of an n-type impurity in the range of $1 \times 10^{18}$ cm$^{-3}$ to $2 \times 10^{18}$ cm$^{-3}$, a composition of 1.13 μm, and a thickness of 60 nm. The n-InP spacer layer 24 has a concentration of an n-type impurity in the range of $1 \times 10^{18}$ cm$^{-3}$ to $2 \times 10^{18}$ cm$^{-3}$, and a thickness of 60 nm. The p-InP clad layer 5 has a concentration of a p-type impurity in the range of $5 \times 10^{17}$ cm$^{-3}$ to $7 \times 10^{17}$ cm$^{-3}$, and a thickness in the range of 0.1 μm to 0.2 μm.

A stand-by time until a temperature reaches a crystal growth temperature, and flow rates of PH$_3$ and AsH$_3$ are controlled so that the diffraction lattice 22 has a height of 27 nm after having been buried.

The MQW active layer 4 is comprised of (a) an n-InGaAsP SCH layer having a composition of 1.13 μm, a concentration in the range of $1\times10^{18}$ cm$^{-3}$ to $2\times10^{18}$ cm$^{-3}$, and a thickness of 20 nm, (b) ten strained InGaAsP quantum well layers having 0.9% compression strain and a thickness of 4 nm, (c) an InGaAsP barrier layer having a composition of 1.13 μm and a thickness of 7 nm, and (d) a u-InGaAsP SCH layer having a composition of 1.13 μm and a thickness of 60 nm.

Then, there are formed masks only on the waveguide layers. Then, as illustrated in FIG. 4F, a p-InP block layer 7 and an n-InP block layer 8 are successively deposited over a resultant around the masks.

The p-InP block layer 7 has a concentration of a p-type impurity in the range of $4\times10^{17}$ cm$^{-3}$ to $6\times10^{17}$ cm$^{-3}$, and a thickness of 0.4 μm. The n-InP block layer 8 has a concentration of an n-type impurity in the range of $7\times10^{17}$ cm$^{-3}$ to $9\times10^{17}$ cm$^{-3}$, and a thickness of 0.5 μm.

Figure 4F:
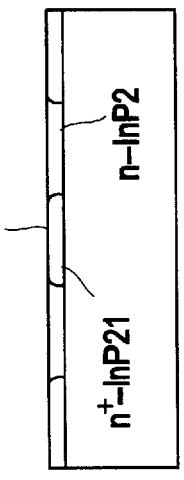

Then, as illustrated in FIG. 4F, a resultant is covered with a p-InP clad layer 9, and further with a p$^+$-InGaAs cap layer 10. The p-InP clad layer 9 has a concentration of a p-type impurity of $1\times10^{18}$ cm$^{-3}$, and a thickness of 2 μm. The p$^+$-InGaAs cap layer 10 has a concentration of a p-type impurity of $1\times10^{19}$ cm$^{-3}$, and a thickness of 0.2 μm.

The experiment was conducted to confirm that a semiconductor laser fabricated in accordance with the above-mentioned method had superior output characteristic.

A semiconductor laser fabricated in accordance with the above-mentioned method was cleaved into a resonator length of 300 μm so that λ/4 shift position is located at the center of a pellet. Opposite ends of the thus cleaved semiconductor laser are coated with AR coat composed of a SiN film. Then, the semiconductor laser was mounted on an aluminum-nitride heat sink in junction-down, and optical output characteristic of the semiconductor laser was measured. The semiconductor laser showed that a threshold value was 10 mA and a slope efficiency was 0.35 W/A both at room temperature, and a threshold value was 20 mA and a slope efficiency was 0.25 W/A both at 85 degrees centigrade, and that a drive current at optical output of 10 mW was 65 mA.

There occurred single mode oscillation at an oscillation wavelength of 1.3 μm and at a sub-mode suppression ratio of 50 dB.

In a conventional semiconductor laser where a region located just below a p-InP block layer had a p-type impurity concentration of $1\times10^{18}$ cm$^{-3}$, a drive current at optical output of 10 mW was 80 mA.

In comparison with the conventional semiconductor laser, it was confirmed that the semiconductor laser in accordance with the instant embodiment had superior high-temperature characteristics.

[Fourth Embodiment]

FIGS. 5A to 5F illustrate respective steps of a method of fabricating a semiconductor laser, in accordance with the fourth embodiment.

Figure 5A:
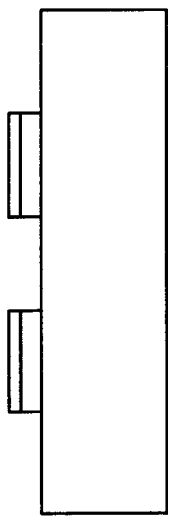
FIGS. 5A to 5F are cross-sectional views of a semiconductor laser, illustrating respective steps of a method of fabricating the same, in accordance with the fourth embodiment.

First, as illustrated in FIG. 5A, a lightly doped n-type InP layer 2 (n$^-$-InP) is formed on a heavily doped n-InP substrate 1. The lightly doped n-type InP layer 2 has a concentration of an n-type impurity of $1\times10^{17}$ cm$^{-3}$ and a thickness in the range of 0.5 to 1 μm. The heavily doped n-InP substrate 1 has a concentration of an n-type impurity in the range of $1\times10^{18}$ cm$^{-3}$ to $3\times10^{18}$ cm$^{-3}$.

Figure 5B:
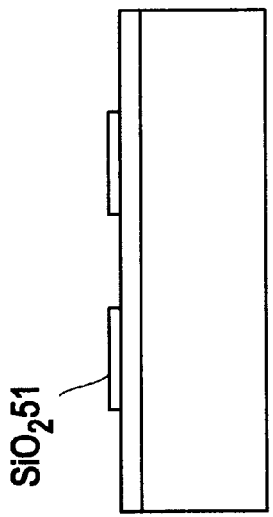

Then, as illustrated in FIG. 5B, a pair of masks 51 is formed on the n-InP substrate 1 by photolithography. The masks 51 are composed of dielectric material such as SiO$_2$. The masks 51 may be composed of SiN in place of SiO$_2$. Each of the masks 51 is designed to have a width in the range of 3 to 5 μm. A space between a pair of the masks 51, that is, a width of an area in which an active layer is to be formed, is in the range of 1.2 to 1.6 μm.

Figure 5C:
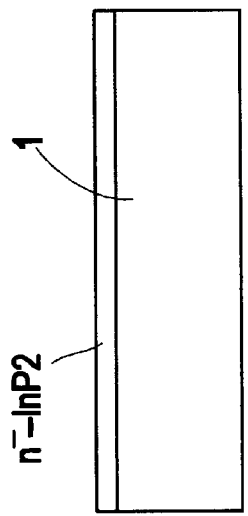

Then, as illustrated in FIG. 5C, the lightly doped n-type InP layer 2 is partially removed by dry etching through the use of the masks 51.

Figure 5D:
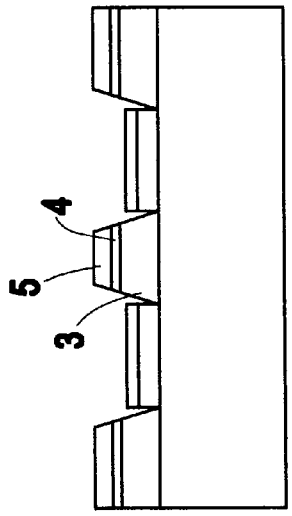

Then, as illustrated in FIG. 5D, there is formed a waveguide layer including an n-InP clad layer 3, an MQW active layer 4, and a p-InP clad layer 5, on the exposed area of the n-InP substrate 1 by selective growth.

The n-InP clad layer 3 has a concentration of an n-type impurity in the range of $1\times10^{18}$ cm$^{-3}$ to $2\times10^{18}$ cm$^{-3}$, and a thickness in the range of 0.1 μm to 0.2 μm. The p-InP clad layer 5 has a concentration of a p-type impurity in the range of $5\times10^{17}$ cm$^{-3}$ to $7\times10^{17}$ cm$^{-3}$, and a thickness in the range of 0.1 μm to 0.2 μm The MQW active layer 4 is comprised of (a) an n-InGaAsP SCH layer having a composition of 1.13 μm, a concentration in the range of $1\times10^{18}$ cm$^{-3}$ to $2\times10^{18}$ cm$^{-3}$, and a thickness of 33 nm, (b) five strained InGaAsP quantum well layers having 0.8% compression strain and a thickness of 4.5 nm, (c) an InGaAsP barrier layer having a composition of 1.2 μm and a thickness of 7 nm, and (d) a u-InGaAsP SCH layer having a composition of 1.13 μm and a thickness of 33 nm.

Figure 5E:
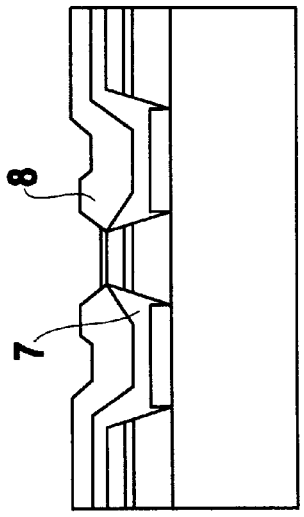

Then, there are formed masks only on the waveguide layers. Then, as illustrated in FIG. 5E, a p-InP block layer 7 and an n-InP block layer 8 are successively deposited over a resultant around the masks.

The p-InP block layer 7 has a concentration of a p-type impurity in the range of $4\times10^{17}$ cm$^{-3}$ to $6\times10^{17}$ cm$^{-3}$, and a thickness of 0.6 μm. The n-InP block layer 8 has a concentration of an n-type impurity in the range of $7\times10^{17}$ cm$^{-3}$ to $9\times10^{17}$ cm$^{-3}$, and a thickness of 0.6 μm.

Figure 5F:
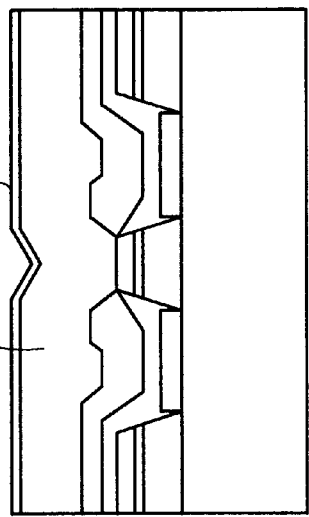

Then, as illustrated in FIG. 5F, a resultant is covered with a p-InP clad layer 9, and further with a p$^+$-InGaAs cap layer 10. The p-InP clad layer 9 has a concentration of a p-type impurity of $1\times10^{18}$ cm$^{-3}$, and a thickness of 2 μm. The p$^+$-InGaAs cap layer 10 has a concentration of a p-type impurity of $1\times10^{19}$ cm$^{-3}$, and a thickness of 0.2 μm.

In accordance with the above-mentioned method, since the masks 51 are used commonly for dry etching and selective growth, it is possible to form the heavily doped n-type InP layer just below the active layer 4, and form the lightly doped n-type InP layer 2 just below the p-InP block layer 7 in self-align manner.

The experiment was conducted to confirm that a semiconductor laser fabricated in accordance with the above-mentioned method had superior output characteristic.

A semiconductor laser fabricated in accordance with the above-mentioned method was cleaved into a resonator length of 1200 μm. An AR film having a reflectance of 6% and composed of SiO$_2$ was formed at a front end, and a high reflectance film having a reflectance of 90% and constituted of SiO$_2$/α-Si multiple layers was formed at a rear end of the thus cleaved semiconductor laser.

Then, the semiconductor laser was mounted on a boron-nitride heat sink in junction-down, and optical output characteristic of the semiconductor laser was measured. The semiconductor laser was oscillated at 1.48 μm, and there was obtained an optical output of 210 W at a drive current of 500 mA at room temperature.

In a conventional semiconductor laser where a region located just below a p-InP block layer had a p-type impurity concentration of $1\times10^{18}$ cm$^{-3}$, an optical output was 180 mW.

In comparison with the conventional semiconductor laser, it was confirmed that the semiconductor laser in accordance with the instant embodiment had superior high-output characteristics. The reason for this is that a breakdown voltage of the thyrister is enhanced because electrons are disallowed to enter the p-InP block layer 7 even when much current is applied to the thyrister.

[Fifth Embodiment]

FIGS. 6A to 6E illustrate respective steps of a method of fabricating a semiconductor laser, in accordance with the fifth embodiment.

Figure 6A:
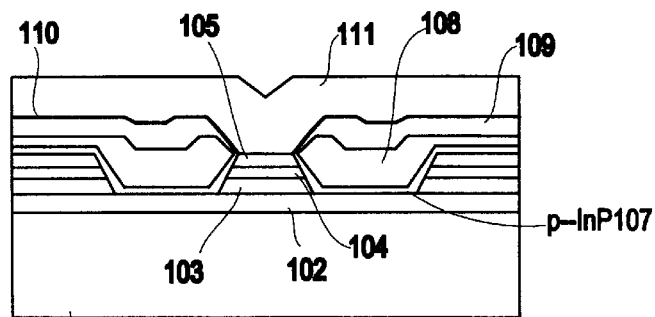
FIGS. 6A to 6E are cross-sectional views of a semiconductor laser, illustrating respective steps of a method of fabricating the same, in accordance with the fifth embodiment.

First, as illustrated in FIG. 6A, a lightly doped p-type InP layer 102 (p⁻-InP) is formed on a heavily doped p-InP substrate 101. The lightly doped p-type InP layer 102 has a concentration of a p-type impurity of $1\times10^{17}$ cm$^{-3}$ and a thickness of 2 μm. The heavily doped p-InP substrate 101 has a concentration of a p-type impurity in the range of $1\times10^{18}$ cm$^{-3}$ to $3\times10^{18}$ cm$^{-3}$.

Then, a pair of masks (not illustrated) is formed on the lightly doped p-InP layer 102 by photolithography. The masks are composed of dielectric material such as SiO$_2$ and SiN. Each of the masks is designed to have a width in the range of 3 to 5 μm. A space between a pair of the masks, that is, a width of an area in which an active layer is to be formed, is in the range of 1.2 to 1.6 μm.

Then, there is formed a waveguide layer including a p-InP clad layer 103, an MQW active layer 104, and an n-InP clad layer 105, on the lightly doped p-InP layer 102 by selective growth.

The p-InP clad layer 103 has a concentration of a p-type impurity of $7\times10^{18}$ cm$^{-3}$, and a thickness in the range of 0.1 μm to 0.2 μm. The n-InP clad layer 105 has a concentration of a p-type impurity of $1\times10^{18}$ cm$^{-3}$, and a thickness in the range of 0.1 μm to 0.2 μm.

The MQW active layer 104 is comprised of (a) a u-InGaAsP SCH layer having a composition of 1.13 μm, a concentration of $7\times10^{17}$ cm$^{-3}$, and a thickness of 33 nm, (b) five strained InGaAsP quantum well layers having 1% compression strain and a thickness of 4.5 nm, (c) an InGaAsP barrier layer having a composition of 1.2 μm and a thickness of 7 nm, and (d) an n-InGaAsP SCH layer having a composition of 1.13 μm and a thickness of 33 nm.

Then, there are formed masks only on the waveguide layers. Then, a p-InP block layer 107, an n-InP block layer 108, a p-InP block layer 109, and a p-InGaAsP etching stopper layer 110 are successively deposited over a resultant around the masks.

The p-InP block layer 107 has a concentration of a p-type impurity in the range of $4\times10^{17}$ cm$^{-3}$ to $6\times10^{17}$ cm$^{-3}$, and a thickness of 0.2 μm. The n-InP block layer 8 has a concentration of an n-type impurity in the range of $7\times10^{17}$ cm$^{-3}$ to $9\times10^{17}$ cm$^{-3}$, and a thickness of 0.6 μm. The p-InP block layer 109 has a concentration of a p-type impurity in the range of $4\times10^{17}$ cm$^{-3}$ to $6\times10^{17}$ cm$^{-3}$, and a thickness of 0.6 μm. The p-InGaAsP etching stopper layer has a composition of 1.10 μm and a thickness of 0.1 μm.

Then, a resultant is covered with an n-InP clad layer 111. The n-InP clad layer 111 has a concentration of an n-type impurity of $1\times10^{18}$ cm$^{-3}$, and a thickness of 2 μm. Thus, there is completed such a product as illustrated in FIG. 6A.

Figure 6B:
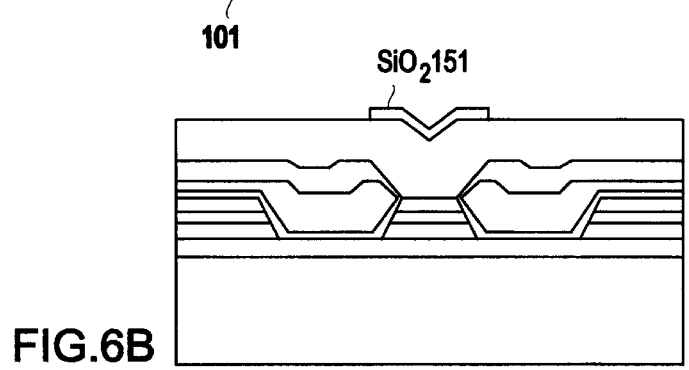

Then, as illustrated in FIG. 6B, a mask 151 composed of SiO$_2$ and having a width of 2 μm is formed on the n-InP clad layer 111 above the MQW active layer 104.

Figure 6C:
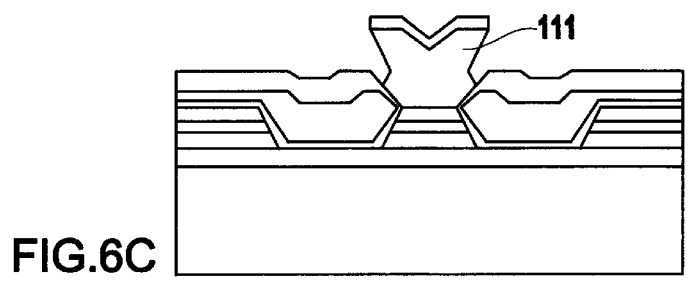

Then, the n-InP clad layer 111 is partially etched through the use of the mask 151, as illustrated in FIG. 6C. Since the p-InGaAsP etching stopper layer 110 is formed on the p-InP block layer 109, the p-InP block layer 109 is not etched.

Figure 6D:
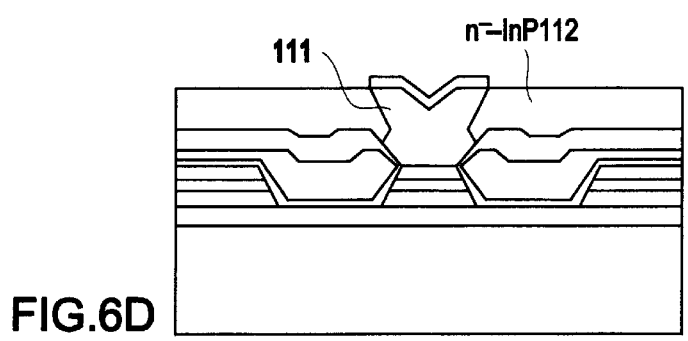

Then, as illustrated in FIG. 6D, a lightly doped n-InP layer 112 is deposited all over, a resultant through the use of the mask 151 so that a resultant is almost planarized.

Figure 6E:
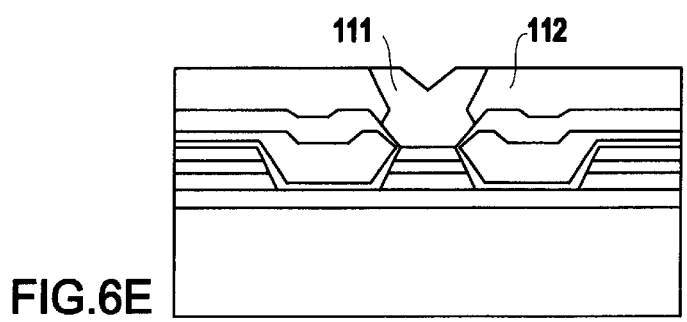

Then, as illustrated in FIG. 6E, the mask 151 is removed.

The experiment was conducted to confirm that a semiconductor laser fabricated in accordance with the above-mentioned method had superior output characteristic.

A semiconductor laser fabricated in accordance with the above-mentioned method was cleaved into a resonator length of 900 μm. An AR film having a reflectance of 6% and composed of SiO$_2$ was formed at a front end, and a high reflectance film having a reflectance of 90% and constituted of SiO$_2$/α-Si multiple layers was formed at a rear end of the thus cleaved semiconductor laser.

Then, the semiconductor laser was mounted on a boron-nitride heat sink in junction-down, and optical output characteristic of the semiconductor laser was measured. The semiconductor laser was oscillated at 1.55 μm, and there was obtained an optical output of 300 W at a pulse drive current of 1A at room temperature, wherein a pulse width was 1 nsec, and a duty ratio was 1%. The reason for this is that a breakdown voltage of the thyrister is enhanced because electrons are disallowed to enter the p-InP block layer 109 even when much current is applied to the thyrister.

[Sixth Embodiment]

Figure 7A:
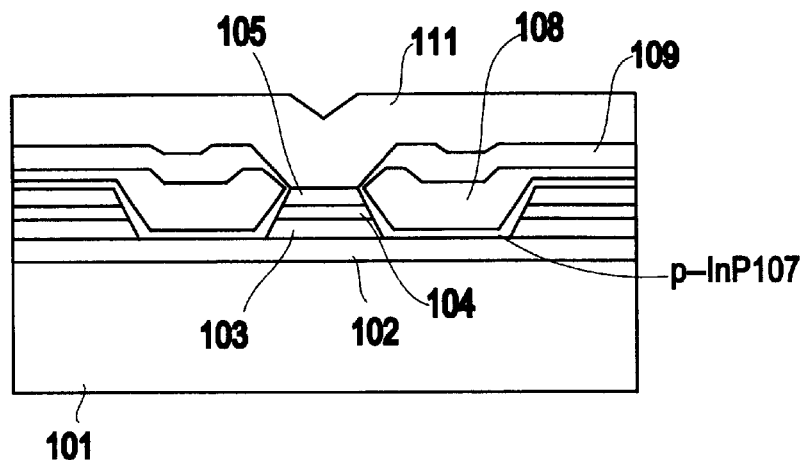
FIGS. 7A to 7C are cross-sectional views of a semiconductor laser, illustrating respective steps of a method of fabricating the same, in accordance with the sixth embodiment.
Figure 7B:
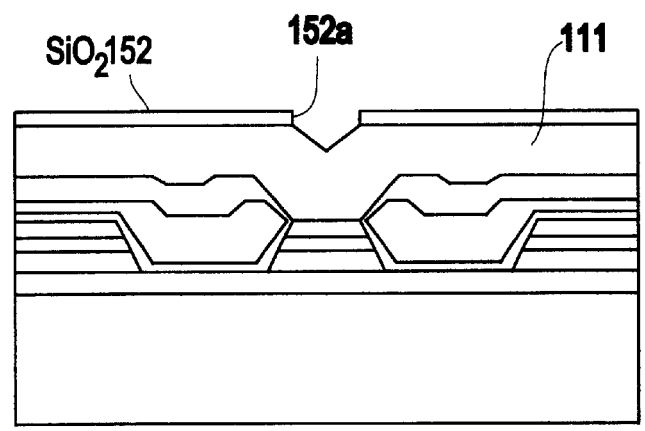
Figure 7C:
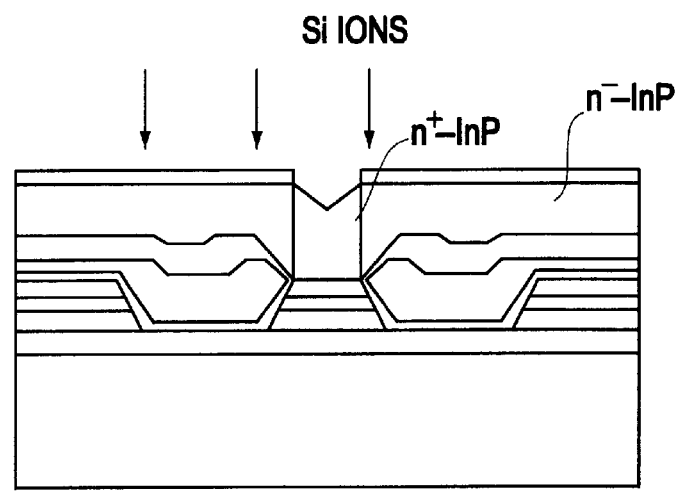

FIGS. 7A to 7C illustrates respective steps of a method of fabricating a semiconductor laser, in accordance with the sixth embodiment.

First, as illustrated in FIG. 7A, a lightly doped p-type InP layer 102 (p⁻-InP) is formed on a heavily doped p-InP substrate 101. The lightly doped p-type InP layer 102 has a concentration of a p-type impurity of $7\times10^{17}$ cm$^{-3}$ and a thickness of 2 μm. The heavily doped p-InP substrate 101 has a concentration of a p-type impurity in the range of $1\times10^{18}$ cm$^{-3}$ to $3\times10^{18}$ cm$^{-3}$.

Then, a pair of masks (not illustrated) is formed on the lightly doped p-InP layer 102 by photolithography. The masks are composed of dielectric material such as SiO$_2$ and SiN. Each of the masks is designed to have a width in the range of 3 to 5 μm. A space between a pair of the masks, that is, a width of an area in which an active layer is to be formed, is in the range of 1.2 to 1.6 μm.

Then, there is formed a waveguide layer including a p-InP clad layer 103, an MQW active layer 104, and an n-InP clad layer 105, on the lightly doped p-InP layer 102 by selective growth.

The p-InP clad layer 103 has a concentration of a p-type impurity of $7\times10^{18}$ cm$^{-3}$, and a thickness in the range of 0.1 μm to 0.2 μm. The n-InP clad layer 105 has a concentration of a p-type impurity of $1\times10^{18}$ cm$^{-3}$, and a thickness in the range of 0.1 μm to 0.2 μm.

The MQW active layer 104 is comprised of (a) a u-InGaAsP SCH layer having a composition of 1.05 μm, a concentration of $7\times10^{17}$ cm$^{-3}$, and a thickness of 33 nm, (b) five strained InGaAsP quantum well layers having 1% compression strain and a thickness of 4.5 nm, (c) an InGaAsP barrier layer having a composition of 1.13 μm and a thickness of 7 nm, and (d) an n-InGaAsP SCH layer having a composition of 1.05 μm and a thickness of 33 nm.

Then, there are formed masks only on the waveguide layers. Then, a p-InP block layer 107, an n-InP block layer 108, and a p-InP block layer 109 are successively deposited over a resultant around the masks.

The p-InP block layer 107 has a concentration of a p-type impurity in the range of $4\times10^{17}$ cm$^{-3}$ to $6\times10^{17}$ cm$^{-3}$, and a thickness of 0.2 μm. The n-InP block layer 8 has a concentration of an n-type impurity in the range of $7\times10^{17}$ cm$^{-3}$ to $9\times10^{17}$ cm$^{-3}$, and a thickness of 0.6 μm. The p-InP block layer 109 has a concentration of a p-type impurity in the range of $4\times10^{17}$ cm$^{-3}$ to $6\times10^{17}$ cm$^{-3}$, and a thickness of 0.6 μm.

Then, a resultant is covered with an n-InP clad layer 111. The n-InP clad layer 111 has a concentration of an n-type impurity of $1\times10^{17}$ cm$^{-3}$, and a thickness of 2 μm. Thus, there is completed such a product as illustrated in FIG. 7A.

Then, as illustrated in FIG. 7B, a mask 152 composed of SiO$_2$ and having a width of 2 μm is formed on the n-InP clad layer 111 by photolithography. The mask 152 is designed to have an opening 152a located just above the MQW active layer 104.

Then, as illustrated in FIG. 7C, an n-type impurity such as Si is ion-implanted into the n-InP clad layer 111 through the opening 152a of the mask 152 to thereby turn a portion of the n-InP clad layer 111 located just above the MQW active layer 104, into a heavily doped portion having a concentration of an n-type impurity in the range of $1\times10^{18}$ cm$^{-3}$ to $2\times10^{18}$ cm$^{-3}$.

Thereafter, the mask 152 is removed. Thus, there is completed the semiconductor laser in accordance with the sixth embodiment.

The experiment was conducted to confirm that a semiconductor laser fabricated in accordance with the above-mentioned method had superior output characteristic.

A semiconductor laser fabricated in accordance with the above-mentioned method was cleaved into a resonator length of 900 μm. An AR film having a reflectance of 6% and composed of SiO$_2$ was formed at a front end, and a high reflectance film having a reflectance of 90% and constituted of SiO$_2$/α-Si multiple layers was formed at a rear end of the thus cleaved semiconductor laser.

Then, the semiconductor laser was mounted on a boron-nitride heat sink in junction-down, and optical output characteristic of the semiconductor laser was measured. The semiconductor laser was oscillated at 1.3 μm, and there was obtained an optical output of 400 W at a pulse drive current of 1A at room temperature, wherein a pulse width was 1 nsec, and a duty ratio was 1%. The reason for this is that a breakdown voltage of the thyrister is enhanced because electrons are disallowed to enter the p-InP block layer 109 even when much current is applied to the thyrister.

While the present invention has been described in connection with certain preferred embodiments, it is to be understood that the subject matter encompassed by way of the present invention is not to be limited to those specific embodiments. On the contrary, it is intended for the subject matter of the invention to include all alternatives, modifications and equivalents as can be included within the spirit and scope of the following claims.

The entire disclosure of Japanese Patent Application No. 10-168601 filed on Jun. 16, 1998 including specification, claims, drawings and summary is incorporated herein by reference in its entirety.

What is claimed is:

1. A method of fabricating a semiconductor laser, comprising:
    forming a lightly doped n-type semiconductor layer on or in an n-type semiconductor substrate;
    ion-implanting an n-type impurity to said lightly doped n-type semiconductor layer to thereby partially turn said lightly doped n-type semiconductor layer into a heavily doped n-type semiconductor layer;
    forming a light-waveguide layer on said heavily doped n-type semiconductor layer, said light-waveguide layer including an active layer;
    forming a first p-type semiconductor layer on said lightly doped n-type semiconductor layer;
    forming an n-type semiconductor layer on said first p-type semiconductor layer; and
    forming a second p-type semiconductor layer on said light-waveguide layer and said n-type semiconductor layer.

2. The method as set forth in claim 1, wherein said heavily doped n-type semiconductor layer contains an impurity at $5\times10^{17}$ to $5\times10^{18}$ cm$^{-3}$.

3. The method as set forth in claim 2, wherein said heavily doped n-type semiconductor layer contains an impurity at $1\times10^{18}$ to $3\times10^{18}$ cm$^{-3}$.

4. The method as set forth in claim 1, wherein said lightly doped n-type semiconductor layer contains an impurity at $3\times10^{17}$ cm$^{-3}$ or smaller.

5. The method as set forth in claim 4, wherein said lightly doped n-type semiconductor layer contains an impurity at $1\times10^{17}$ cm$^{-3}$ or smaller.

6. The method as set forth in claim 4, wherein said lightly doped n-type semiconductor layer contains an impurity at $1\times10^{15}$ cm$^{-3}$ or greater.

7. A method of fabricating a semiconductor laser, comprising:
    forming a heavily doped n-type semiconductor layer on or in an n-type semiconductor substrate;
    forming a lightly doped n-type semiconductor layer entirely covering said heavily doped n-type semiconductor layer therewith;
    at least partially removing said heavily doped n-type semiconductor layer and said lightly doped n-type semiconductor layer to thereby cause said heavily doped n-type semiconductor layer to appear;
    forming a light-waveguide layer on said heavily doped n-type semiconductor layer, said light-waveguide layer including an active layer;
    forming a first p-type semiconductor layer on said lightly doped n-type semiconductor layer;
    forming an n-type semiconductor layer on said first p-type semiconductor layer; and
    forming a second p-type semiconductor layer on said light-waveguide layer and said n-type semiconductor layer.

8. The method as set forth in claim 7, wherein said heavily doped n-type semiconductor layer and said lightly doped n-type semiconductor layer are partially removed in said step (c) by chemical mechanical polishing or dry etching.

9. The method as set forth in claim 7, wherein said heavily doped n-type semiconductor layer contains an impurity at $5\times10^{17}$ to $5\times10^{18}$ cm$^{-3}$.

10. The method as set forth in claim 9, wherein said heavily doped n-type semiconductor layer contains an impurity at $1\times10^{18}$ to $3\times10^{18}$ cm$^{-3}$.

11. The method as set forth in claim 7, wherein said lightly doped n-type semiconductor layer contains an impurity at $3\times10^{17}$ cm$^{-3}$ or smaller.

12. The method as set forth in claim 11, wherein said lightly doped n-type semiconductor layer contains an impurity at $1\times10^{17}$ cm$^{-3}$ or smaller.

13. The method as set forth in claim 11, wherein said lightly doped n-type semiconductor layer contains an impurity at $1\times10^{15}$ cm$^{-3}$ or greater.

14. A method of fabricating a semiconductor laser, comprising:
    forming a first lightly doped p-type semiconductor layer on or in a p-type semiconductor substrate;
    forming a light-waveguide layer on said first lightly doped p-type semiconductor layer, said light-waveguide layer including an active layer;
    forming a second lightly doped p-type semiconductor layer on said first lightly doped p-type semiconductor layer;

forming a first n-type semiconductor layer on said second lightly doped p-type semiconductor layer;

forming a first p-type semiconductor layer on said first n-type semiconductor layer;

forming an etching stopper layer on said first p-type semiconductor layer;

forming a second n-type semiconductor layer on said light-waveguide layer and said etching stopper layer;

etching said second n-type semiconductor layer so that a portion of said second n-type semiconductor layer remains only above said light-waveguide layer; and depositing a second lightly doped n-type semiconductor layer on said etching stopper layer around said portion of said second n-type semiconductor layer.

15. The method as set forth in claim 14, wherein said second lightly doped n-type semiconductor layer contains an impurity at $3 \times 10^{17}$ cm$^{-3}$ or smaller.

16. The method as set forth in claim 15, wherein said second lightly doped n-type semiconductor layer contains an impurity at $1 \times 10^{17}$ cm$^{-3}$ or smaller.

17. The method as set forth in claim 15, wherein said second lightly doped n-type semiconductor layer contains an impurity at $1 \times 10^{15}$ cm$^{-3}$ or greater.

18. A method of fabricating a semiconductor laser, comprising:

forming a first lightly doped p-type semiconductor layer on or in a p-type semiconductor substrate;

forming a light-waveguide layer on said first lightly doped p-type semiconductor layer, said light-waveguide layer including an active layer;

forming a first n-type semiconductor layer on said first lightly doped p-type semiconductor layer;

forming a p-type semiconductor layer on said first n-type semiconductor layer;

forming a second n-type semiconductor layer on said light-waveguide layer and said p-type semiconductor layer;

forming a mask on said second n-type semiconductor layer, said mask having an opening located just above said light-waveguide layer; and ion-implanting an n-type impurity into said second n-type semiconductor layer through said opening of said mask.

19. The method as set forth in claim 18, wherein said second n-type semiconductor layer contains an impurity at $3 \times 10^{17}$ cm$^{-3}$ or smaller.

20. The method as set forth in claim 19, wherein said second n-type semiconductor layer contains an impurity at $1 \times 10^{17}$ cm$^{-3}$ or smaller.

21. The method as set forth in claim 19, wherein said second n-type semiconductor layer contains an impurity at $1 \times 10^{15}$ cm$^{-3}$ or greater.

* * * * *